US011929277B2

United States Patent
Rogers et al.

(10) Patent No.: US 11,929,277 B2
(45) Date of Patent: Mar. 12, 2024

(54) WAFER PRE-ALIGNER AND METHOD OF PRE-ALIGNING WAFER

(71) Applicants: KABUSHIKI KAISHA YASKAWA DENKI, Kitakyushu (JP); Yaskawa America, Inc., Waukegan, IL (US)

(72) Inventors: John Charles Rogers, Danville, CA (US); Margaret Kathleen Swiecicki, Libertyville, IL (US)

(73) Assignees: KABUSHIKI KAISHA YASKAWA DENKI, Kitakyushu (JP); YASKAWA AMERICA, INC., Waukegan, IL (US)

( * ) Notice: Subject to any disclaimer, the term of this patent is extended or adjusted under 35 U.S.C. 154(b) by 783 days.

(21) Appl. No.: 17/005,378

(22) Filed: Aug. 28, 2020

(65) Prior Publication Data

US 2021/0074566 A1 Mar. 11, 2021

Related U.S. Application Data

(60) Provisional application No. 62/896,866, filed on Sep. 6, 2019.

(51) Int. Cl.
*H01L 21/68* (2006.01)
*G01N 21/43* (2006.01)
*G01N 21/95* (2006.01)

(52) U.S. Cl.
CPC ........... *H01L 21/681* (2013.01); *G01N 21/43* (2013.01); *G01N 21/9501* (2013.01); *H01L 21/68* (2013.01)

(58) Field of Classification Search
CPC ..... G01N 21/9501; G01N 21/43; G01N 21/68
See application file for complete search history.

(56) References Cited

U.S. PATENT DOCUMENTS 6,275,742 B1 * 8/2001 Sagues ................. H01L 21/681
414/936
2004/0005212 A1 * 1/2004 Wu ......................... H01L 21/68
414/757

(Continued)

FOREIGN PATENT DOCUMENTS

CN 1787200 6/2006
CN 103199046 7/2013

(Continued)

OTHER PUBLICATIONS

Notice of Eligibility for Grant w/ Search Report and Examination Report for corresponding SG application No. 10202008623S, dated Jul. 30, 2021.

(Continued)

*Primary Examiner* — Vincent H Tran
(74) *Attorney, Agent, or Firm* — MORI & WARD, LLP

(57) ABSTRACT

A pre-aligner for pre-aligning a wafer having a notch. The pre-aligner includes a wafer platform having a wafer receiving surface, and a drive device. A detector is provided to detect the notch, and a memory is provided to store a notch window defining a range of angles in which the notch is predicted to be located in relation to a start position. A controller performs a pre-alignment operation where the wafer is rotated from the start position to an alignment location. The controller performs the operation such that the wafer is rotated at maximum acceleration/deceleration values from the start position to a notch location detected by the detector: where the operation is limited to a maximum velocity for rotation of the wafer from the start position to a notch window; and where the operation is limited to a scanning velocity within the notch window until the notch location is detected.

20 Claims, 10 Drawing Sheets

(56) References Cited

U.S. PATENT DOCUMENTS

| | | | |
|---|---|---|---|
| 2005/0078312 A1 | 4/2005 | Fukuzaki et al. | |
| 2013/0085595 A1* | 4/2013 | Kiley | H01L 21/67259 |
| | | | 700/121 |
| 2016/0086325 A1* | 3/2016 | Efraty | H01L 21/681 |
| | | | 348/94 |
| 2016/0098041 A1* | 4/2016 | Otsuji | G05B 19/19 |
| | | | 318/601 |
| 2020/0006103 A1* | 1/2020 | Watanabe | H01L 21/681 |

FOREIGN PATENT DOCUMENTS

| | | | | |
|---|---|---|---|---|
| JP | H03-189502 | | 8/1991 | |
| JP | H03189502 A | | 8/1991 | |
| JP | H10256350 A | * | 9/1998 | ............ H01L 21/68 |
| JP | 2000-21956 | | 1/2000 | |
| JP | 2000021956 A | | 1/2000 | |
| JP | 2006-313864 | | 11/2006 | |
| JP | 2006313864 A | | 11/2006 | |

OTHER PUBLICATIONS

Extended European Search Report for corresponding EP Application No. 20194650.6, dated Feb. 8, 2021.
Communication under Rule 71(3) EPC for corresponding EP application No. 20 194 650.6, dated Feb. 24, 2022.

* cited by examiner

WAFER PRE-ALIGNER AND METHOD OF PRE-ALIGNING WAFER

CROSS-REFERENCE TO RELATED APPLICATION

The present application claims priority to U.S. Provisional Application No. 62/896,866, filed on Sep. 6, 2019, the entire contents of which are herein incorporated by reference.

BACKGROUND OF THE INVENTION

Field of the Invention

The present invention relates to pre-aligning of semiconductor wafers.

Discussion of the Background

A pre-aligner is used to identify a location of a notch on a semiconductor wafer. A robot places the wafer on a chuck of the pre-aligner. The pre-aligner rotates a wafer chuck and thus the wafer in order to search for the notch. With the notch identified, the wafer is then oriented to a final orientation as prescribed by a process that is to be performed on the wafer.

The notch's position upon arrival to the pre-aligner can be anywhere with respect to the pre-aligner depending on a previous process performed on the wafer and/or a movement operation of the robot. Thus, in some related art pre-aligners, when searching for the notch, the pre-aligner must scan slowly (i.e., at no greater than a scanning velocity, which is a maximum velocity at which the pre-aligner can accurately detect the notch) from a start of rotation until the pre-aligner detects the notch, as can be seen in FIG. 13, which shows a plan view of a location of the wafer in relation to a corresponding acceleration versus time graph and a corresponding velocity versus time graph. In such a pre-aligner, the pre-aligner begins rotation at location "A" along the velocity versus time graph in FIG. 13 and speeds up until the rotation reaches the scanning velocity at location "B" and then maintains the scanning velocity until the notch is detected at location "C". Thus, in some related art pre-aligners, the wafer must be scanned at a velocity no greater than the scanning velocity until the notch is located, then the wafer is decelerated (e.g., from location "C" to location "D" in FIG. 13), and then the wafer is moved to the final orientation (e.g., from location "D" to location "E" in FIG. 13).

In addition, when the robot places the wafer on the chuck of the pre-aligner, a center of the wafer may not be aligned with a center of rotation of the chuck of the pre-aligner. In some related art pre-aligners, a method is used that requires that approximately 360 degrees of rotation of the wafer be scanned in order to locate the center of the wafer.

It has been determined that such related art pre-aligners can be slow in performing pre-alignment of wafers and that significant improvements can be made.

SUMMARY OF THE INVENTION

The present invention advantageously provides a pre-aligner for pre-aligning a wafer having a notch on an outer peripheral edge thereof. The pre-aligner includes a rotation unit including a wafer platform having a wafer receiving surface configured to receive the wafer, and a drive device configured to rotate the wafer platform about an axis. The pre-aligner further includes a detector configured to detect the notch of the wafer when the wafer is received on the wafer receiving surface, a memory configured to store a notch window defining a range of angles in which the notch is predicted to be located in relation to a start position at which the wafer is initially received on the wafer receiving surface, the start position corresponding to a sensing area of the detector, and a controller programmed to perform a pre-alignment operation in which the wafer is rotated from the start position to a predetermined alignment location. The controller is programmed to perform the pre-alignment operation such that the wafer is rotated at maximum acceleration/deceleration values from the start position to a notch location detected by the detector: where the pre-alignment operation is limited to a maximum velocity for rotation of the wafer from the start position to a notch window; and where the pre-alignment operation is limited to a scanning velocity for rotation of the wafer within the notch window until the notch location is detected by the detector, the scanning velocity being less than the maximum velocity.

The present invention advantageously provides a method that includes: providing a wafer platform having a wafer receiving surface configured to receive a wafer having a notch on an outer peripheral edge thereof; providing a detector configured to scan the outer peripheral edge of the wafer to detect the notch of the wafer when the wafer is received on the wafer receiving surface; setting a notch window defining a range of angles in which the notch is predicted to be located in relation to a start position at which the wafer is initially received on the wafer receiving surface, the start position corresponding to a sensing area of the detector; and performing a pre-alignment operation in which the wafer is rotated from the start position to a predetermined alignment location. The pre-alignment operation is performed such that the wafer is rotated at maximum acceleration/deceleration values from the start position to a notch location detected by the detector: where the pre-alignment operation is limited to a maximum velocity for rotation of the wafer from the start position to a notch window; and where the pre-alignment operation is limited to a scanning velocity for rotation of the wafer within the notch window until the notch location is detected by the detector, the scanning velocity being less than the maximum velocity.

The present invention advantageously provides a method that includes: providing a wafer on a wafer platform having a wafer receiving surface, the wafer having a notch on an outer peripheral edge thereof; rotating the wafer on the wafer platform from a start position at which the wafer is initially received on the wafer receiving surface until a detector detects a notch location of the notch in relation to the start position, the start position corresponding to a sensing area of the detector; storing the notch location in a memory; repeating the providing, rotating, and storing for one or more successive wafers to gather and store notch location data in the memory; setting a notch window using the notch location data, the notch window defining a range of angles in which a subsequent notch of a subsequent wafer is predicted to be located in relation to the start position at which the subsequent wafer is initially received on the wafer receiving surface; and performing a pre-alignment operation on the subsequent wafer in which the subsequent wafer is rotated from the start position to a notch location of the subsequent wafer in a first minimum period of time using the notch window.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS OF THE INVENTION

Figure 1:
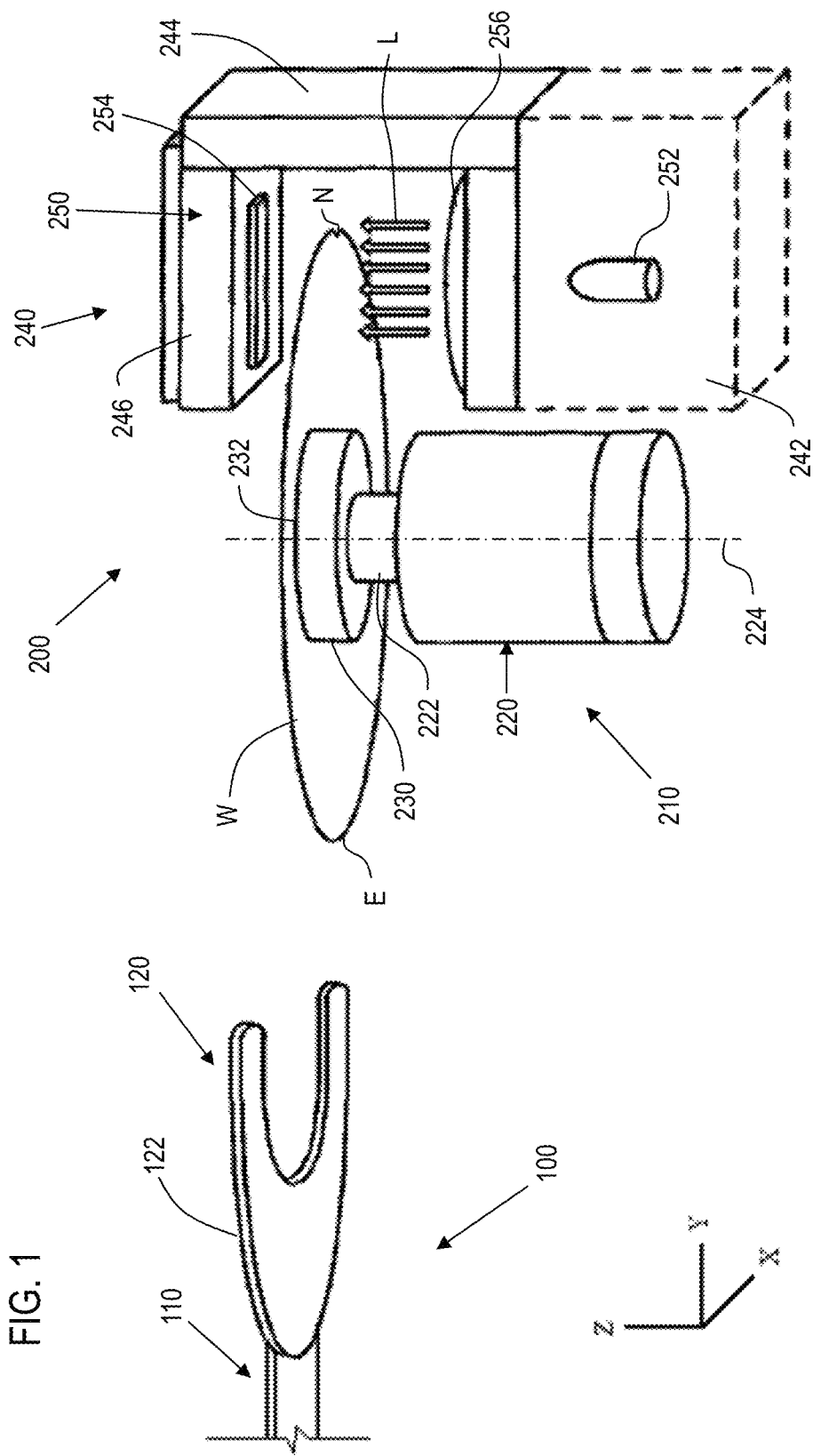
FIG. 1 is a perspective view of a robot and a pre-aligner according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

In semiconductor manufacturing, it is important to accurately determine a location (i.e., position and orientation) of a semiconductor wafer in order to accurately perform precise manufacturing processes on the semiconductor wafer. As a wafer is moved from processing station to processing station, for example, by using a robot such as an atmospheric, articulated robot, it is important to determine the location of the semiconductor wafer certain processing stations. For example, a pre-aligner can be used to identify a location of a notch on a periphery of a semiconductor wafer in order for the pre-aligner to determine the location of the semiconductor wafer.

FIG. 1 depicts a perspective view of a robot 100 including an arm member 110 and an end effector 120. The robot 100 can be configured as an articulated robot having a robot arm with one or more arm members that are rotatable with respect to each other, and having the end effector rotatably mounted to an end of the robot arm. The robot 100 is configured to move the end effector in X, Y, and Z directions, as well as pivot the end effector about one or more axes, including at least a Z axis. The end effector has an upper surface 122 that is configured to receive, support, and carry the semiconductor wafer between processing stations during manufacturing, such as from a first processing station to a second processing station.

FIG. 1 depicts a scenario in which the robot 100 has transported a semiconductor wafer W to a processing station including a pre-aligner 200. The pre-aligner 200 is depicted in FIG. 1 as including a rotation unit 210 and a detection unit 240. For simplicity of depiction, the pre-aligner 200 shown in FIG. 1 is depicted without a housing that could be provided to house both the rotation unit 210 and the detection unit 240.

The rotation unit 210 includes a rotational motor (or drive device) 220 having a rotation shaft 222 protruding upward therefrom. The motor 220 can be, for example, an electric motor. The motor 220 is configured to rotate the rotation shaft 222 about rotation axis 224 that extends vertically along the Z axis through a vertical center of rotation shaft 222. A wafer platform, such as a wafer chuck 230, is mounted to a distal end of the rotation shaft 222. The wafer chuck 230 has a wafer receiving surface 232 that is configured to receive the semiconductor wafer W. The rotation axis 224 extends through a rotational center of the wafer platform 230 and a rotational center of the wafer receiving surface 232. The wafer receiving surface 232 supports the wafer, and can be provided with a surface material that provides friction between the wafer W and the wafer receiving surface 232 to prevent the wafer W from moving in relation to the wafer receiving surface 232. Alternatively, or in addition to the surface material, the wafer receiving surface 232 can be provided with suction holes and the wafer chuck 230 can be provided with a suction device to hold the wafer W onto the wafer receiving surface 232 to prevent the wafer W from moving in relation to the wafer receiving surface 232.

The detection unit 240 includes a base 242, a support member 244, and a read head 246. The base 242 supports the support member 244 and the read head 246. The support member 244 supports the read head 246 upon the base 242. The base 242 is mounted within the housing (not shown) of the pre-aligner 200. The base 242 can be mounted to the housing such that the rotation unit 210 and the detection unit 240 can be moved relative to one another. For example, the base 242 can be mounted to the housing such that the detection unit 240 can linearly move closer to and farther from the rotation unit 210 such that the pre-aligner 200 can be used with semiconductor wafers of various diameters.

The detection unit 240 includes a detector 250 configured to sense the presence of a wafer received on the wafer receiving surface 232. In conjunction with the operation of the rotation unit 210, the detector 250 can scan an outer periphery of the wafer W in order to determine alignment (i.e., position and orientation) of the wafer W. (The use of the term "scan" or "scanning" herein includes operation of the detector 250 on the outer periphery of the wafer with or without rotation of the wafer W.)

The detector 250 includes a light source 252 and a light sensor (or optical sensor) 254. In this embodiment, the light source 252 is disposed within the base 242 with a lens 256 provided at an upper end of the base 242. The light sensor 254 is disposed on the read head 246. The light sensor 254 can be, for example, a charge-couple device (CCD) sensor. Light emitted from the light source 252 is collimated by the lens 256 and light L thus collimated is received by the light sensor 254. The detection unit 240 including the read head 246 has the light sensor 254 facing in a −Z direction towards an upper surface of the wafer W that can sense the wafer, such as edges thereof or marks/notches formed thereon, within a sensing area in order to align a semiconductor wafer for inspection and/or for processing. By detecting the receipt or non-receipt of light on sensing devices on the light sensor 254, the detector 250 can determine the presence or absence of an outer peripheral edge E of the wafer W and the presence or absence of a notch provided on the outer peripheral edge E of the wafer W.

The pre-aligner 200 is controlled by one or more controllers, an embodiment of which is described below with respect to FIG. 12. The robot 100 can be controlled by a separate controller from the controller of the pre-aligner, or the robot 100 and the pre-aligner 200 can be controlled by one or more common controllers.

It is noted that a pre-aligner such as pre-aligner 200 will have certain operating parameters within which the pre-aligner is operated. For example, the rotation unit 210 of the pre-aligner 200 will have a maximum angular velocity (also referred to as maximum velocity herein) and a maximum angular acceleration/deceleration (also referred to as maximum acceleration and maximum deceleration herein) at which the pre-aligner can rotate a wafer. Such maximum velocity and maximum acceleration/deceleration values depend upon operating parameters of the motor 220 (e.g., velocity and acceleration/deceleration operating ranges). Such maximum velocity and maximum acceleration/deceleration values as used herein can also depend upon operating parameters of the wafer chuck 230 (e.g., surface friction or suction devices provided therein that ensure the wafer will remain on the wafer chuck within certain velocity and acceleration/deceleration ranges), which could lower these values below the operating parameters of the motor 220. In addition, the pre-aligner will have a maximum scanning velocity (also referred to as scanning velocity herein), which is a maximum velocity at which the detection unit 240 of the pre-aligner can accurately detect the notch. Typically, the scanning velocity is a value lower than the maximum velocity of the motor 220 of the rotation unit 210.

As shown in FIG. 1, the robot 100 has transported the semiconductor wafer W to the processing station including the pre-aligner 200 and placed the wafer on the wafer chuck 230 of the pre-aligner 200. The motor 220 of the pre-aligner 200 rotates the wafer chuck 230 and thus the wafer W in order to search for the notch N using an optical sensor such as detector 250. With the notch N identified, the wafer W is then oriented to a final orientation as prescribed by a process that is to be performed on the wafer W, for example, at the processing station at which the pre-aligner 200 is disposed. The location of the notch N upon arrival to the pre-aligner 200 can vary with respect to the pre-aligner 200 depending on a previous process performed on the wafer W and/or a movement operation of the robot 100.

The pre-aligner 200 is used to identify a location of the notch N on the semiconductor wafer W. It has been determined that the location of the notch N with respect to the pre-aligner 200 upon which the wafers are placed generally consistent from wafer to wafer within some tolerance. In other words, when the robot 100 is repeating the same general movement of a wafer from a previous processing station to the processing station at which the pre-aligner 200 is provided, the wafers are typically positioned and oriented in a similar manner from wafer to wafer within some tolerance. Therefore, a method described herein involves using the pre-aligner 200 to scan for notches of successive wafers using a process similar to the related art depicted in FIG. 13 from location "A" to location "C" along the velocity versus time graph in FIG. 13, and storing notch locations for a number of the successive wafers in a memory (also referred to herein as a notch memory). From the notch locations, a range of notch locations can be set and stored in the notch memory, and such data can be used to define a notch window. The notch window is a range of angles in which the notch is predicted to be located in relation to a start position at which the wafer is initially received on the wafer receiving surface, which the start position corresponds to a sensing area of the detector 250. A numerical value for the number of stored notch locations (i.e., the number of data points) used to set the notch window can be determined such that an operator has a predetermined confidence level in a likelihood that any given notch of a future wafer will fall within the notch window (e.g., 90% or 95% or 99%, etc. of data points fall within a range of 10° to 35° from the start point or a range of 5° to 15° from the start point or a range of −10° to 15° from the start point, etc.). Once the notch window is set, the pre-aligner 200 can scan for notches of wafers using a process in which a maximum acceleration/deceleration and a maximum velocity of the rotation unit 210 are utilized from a start position until the wafer W is rotated to the notch window, and can be utilized during rotation of the wafer W after the notch has been detected, which can advantageously increase the speed at which the notch is detected and the wafer is orientated to a desired alignment location, and advantageously reduce a time period in which the alignment is performed, thereby increasing throughput while maintaining accuracy of the alignment.

Thus, it has been discovered that, when the notch location of successive wafers is proven to be consistent over some number of wafers, then the pre-aligner, rather than scanning slowly, can be moved at maximum acceleration and maximum velocity in an optimal direction to an expected region of the notch (i.e., the notch window), and then the pre-aligner can decelerate the wafer rotation to the scanning velocity in order to detect the notch within the expected region. A kinematic study has been conducted to prove the throughput benefits of the use of such a notch memory, and the benefits can be easily understood through a metaphor, as follows. If a person is searching for a lost dog, the person would typically have to drive around town slowly, while looking for the dog until the person locates the dog within the town. Once the person locates the dog, the person then needs to drive the dog to its owner. In the case of a notch memory process, the person knows that the dog typically loves to run off to a butcher shop. In this case, the person can drive as quickly as possible to the butcher shop, pick up the dog, and return the dog to its owner in a must faster period of time.

Figure 2:
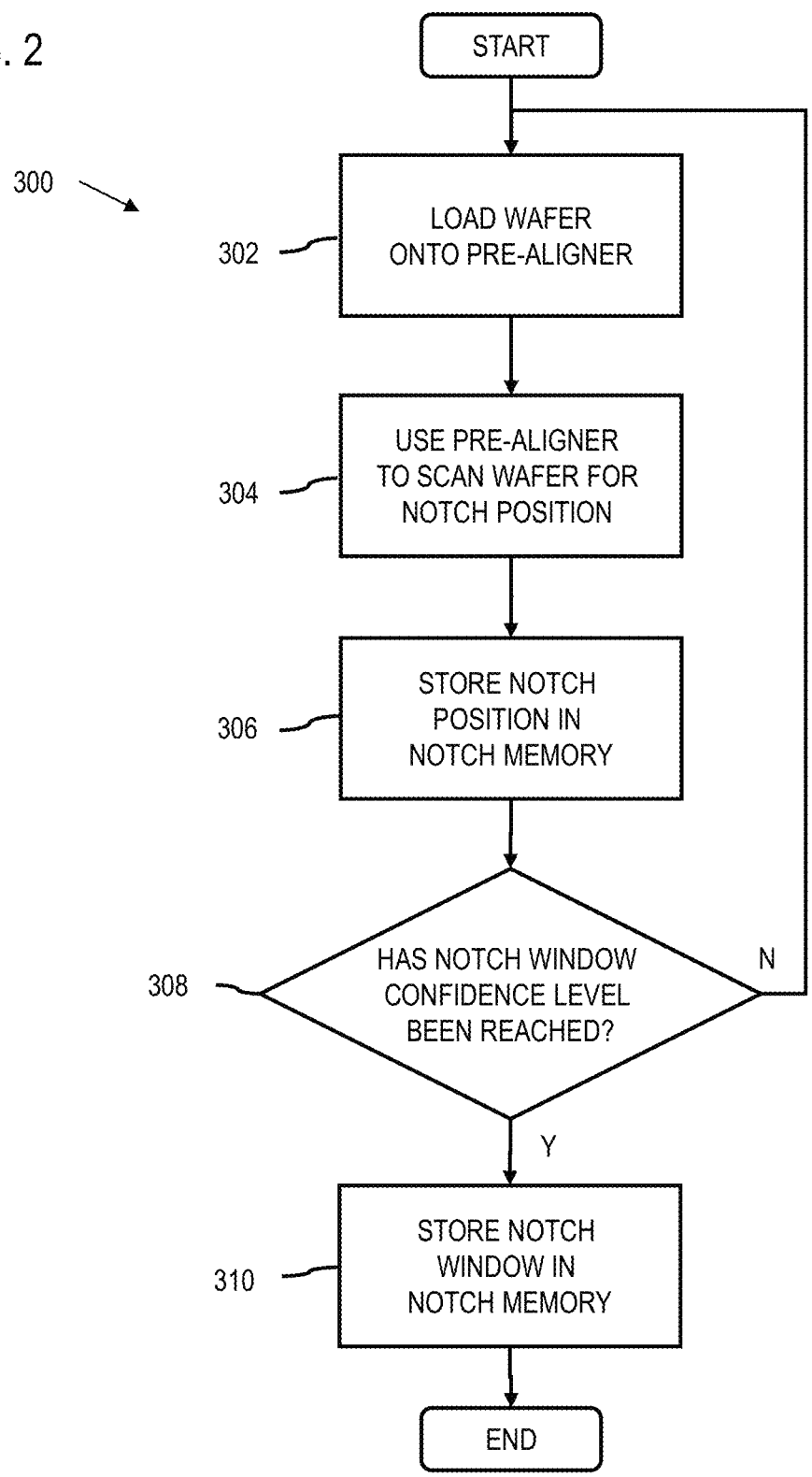
FIG. 2 is a flowchart of a process in which a notch memory is used to store data that allows for improved performance of the pre-aligner.

FIG. 2 depicts a process 300 in which a notch memory is used to store data that allows for improved performance of a pre-aligner. The process 300 includes a step 302 of loading a wafer onto a pre-aligner. For example, as shown in FIG. 1, the robot 100 transports a semiconductor wafer W to a processing station including a pre-aligner 200. The robot 100 uses end effector 120 to place the wafer W onto the wafer receiving surface 232 of the wafer chuck 230, and then the robot 100 moves the end effector 120 away from the pre-aligner. The location of the notch N based on the location of the wafer W.

The process 300 includes a step 304 in which pre-aligner is used to scan the wafer for a notch location. For example, the motor 220 of the rotation unit 210 rotates the rotation shaft 222, thereby rotating the wafer chuck 230 and the wafer W thereon. During this rotation, the detector 250 of the detection unit 240 senses (or scans) the outer peripheral edge E of the wafer W. Light is emitted from the light source 252 and the light is collimated by the lens 256 such that the collimated light L is received by the light sensor 254. The light sensor 254 facing in a −Z direction towards the upper surface of the wafer W senses the wafer, such as edges thereof or marks/notches formed thereon, within the sensing area. By detecting the receipt or non-receipt of light on sensing devices on the light sensor 254, the detector 250 can determine the presence or absence of the outer peripheral edge E of the wafer W and the presence or absence of the notch N provided on the outer peripheral edge of the wafer W. A processor 1204 of a controller 1200 (see FIG. 12) of the pre-aligner 200 will determine if the notch has been detected based on signals from the detection unit 240.

The process 300 further includes a step 306 in which a location of the notch N detected in step 304 is stored in a notch memory, for example, in a memory 1206 of the controller 1200 depicted in FIG. 12 and discussed in greater detail below. The location of the notch N will include an angular value about a center axis of the wafer W in relation to a start position.

The process 300 further includes a step 308 in which the controller determines whether or not a notch window confidence level has been reached. This determination is based upon whether a sufficient number of data points regarding notch points of successive test wafers have been accumulated and stored in order for an operator to have confidence in a likelihood that any given notch of a future wafer will fall within the notch window. For example, if the data points collected are scattered evenly about an entire three hundred and sixty degrees of a center axis of a wafer, then an operator may not be able to set a narrow notch window with an acceptable level of confidence. However, if ninety-five percent of the data points collected are within a thirty degree range extending from ten degrees past the start position to forty degrees past the start position, then the operator can decide to set the notch window at such thirty degree range. The confidence level can be set based on various parameters, for example, a predetermined number of data points have been gathered (e.g., a minimum of 20 data points, a minimum of 40 data points, etc.), and a predetermined percentage (e.g., ninety percent, ninety five percent, etc.) of the data points fall within a predetermined range (e.g., 20 degrees, 30 degrees, etc.) of notch window. Thus, the operator can set the confidence level based upon parameters that achieve a desired outcome. The setting of the notch window in this manner can be performed manually by the operator or by a processor performing an algorithm that takes into account parameters such as described above (i.e. minimum number of data points, percentage of data points that fall within a predetermined range).

Thus, in step 308, if the notch window confidence level has not been reached, then the process 300 loops back to step 302, and another wafer is loaded onto the pre-aligner in order to gather another data point for the notch memory. On the other hand, in step 308, if the notch window confidence level has been reached, then the process 300 moves to step 310.

Figure 12:
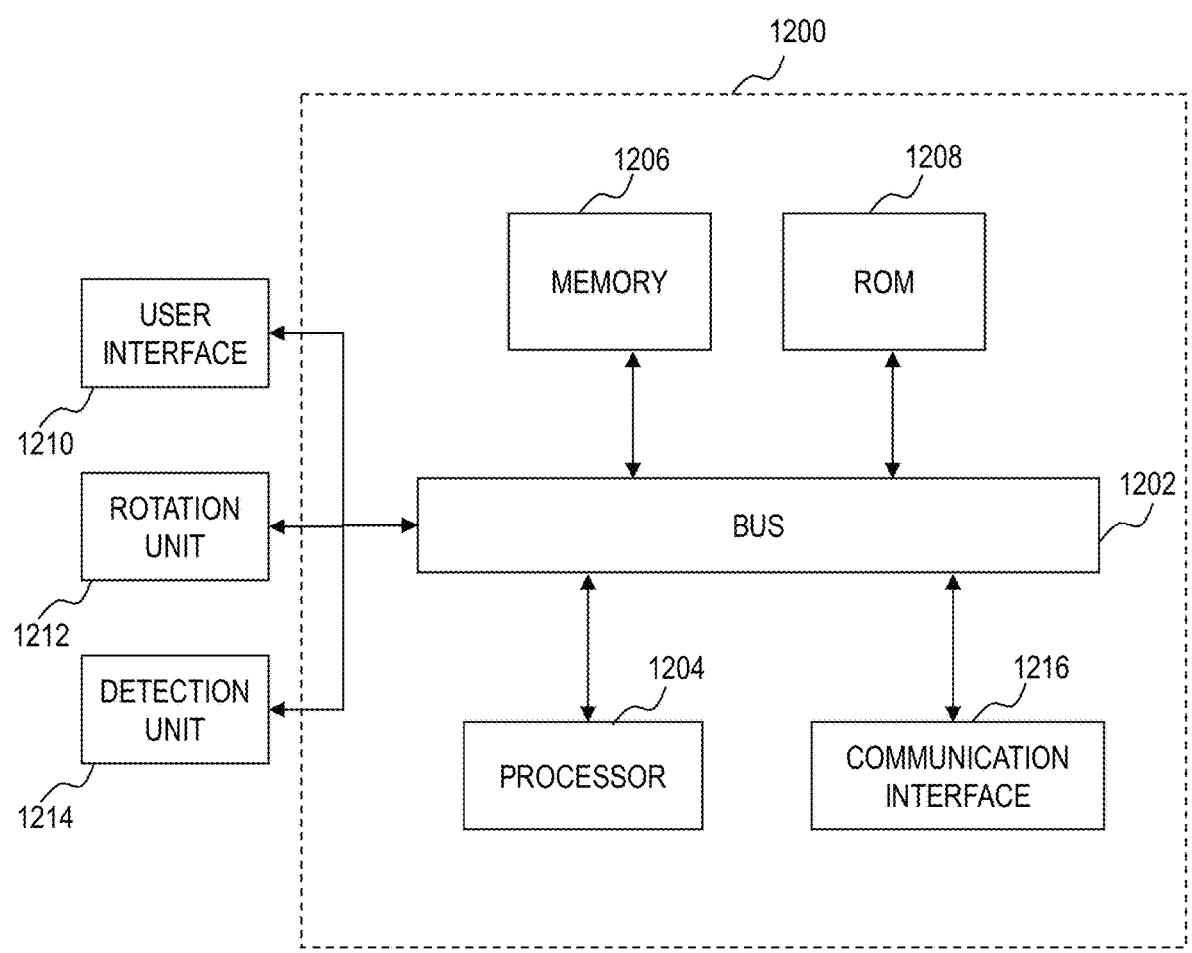
FIG. 12 illustrates an embodiment of a computer system (or controller) with which embodiments of the invention are implemented.

In step 310, the set notch window is stored in the notch memory, for example, in the memory 1206 in FIG. 12. The notch window will include a range of angular values about the center axis of the wafer W in relation to the start position.

Figure 13:
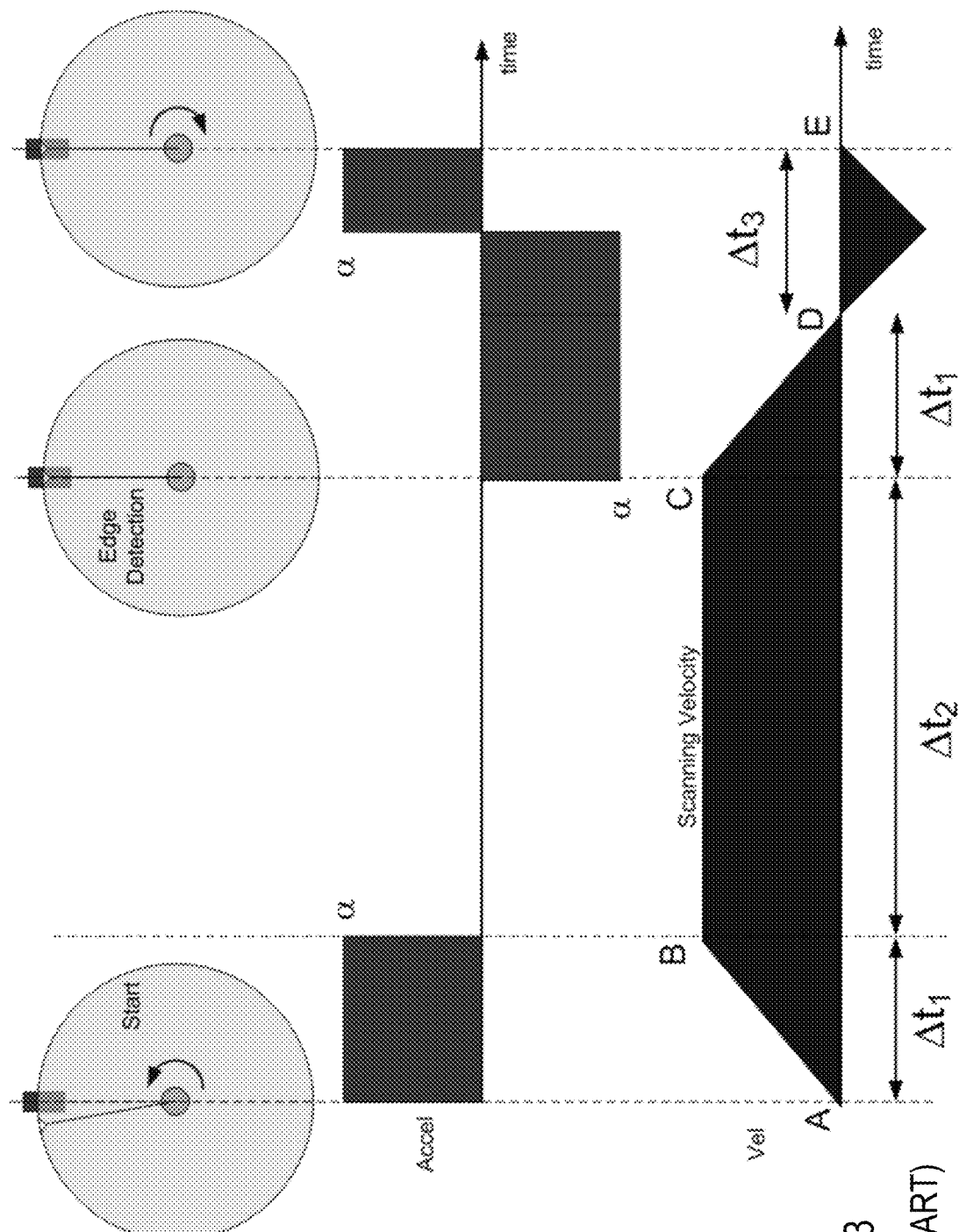
FIG. 13 shows a plan view of a location of a wafer in relation to a corresponding acceleration versus time graph and a corresponding velocity versus time graph of a related art example.

Notably, once each of steps 302 and 304 are performed for each wafer that is processed using process 300, the pre-alignment of that wafer can proceed from step 304 and be completed in the manner shown in FIG. 13 from location "C" to location "E" in order to complete the pre-alignment of the wafers processed in order to set the notch window.

Figure 3:
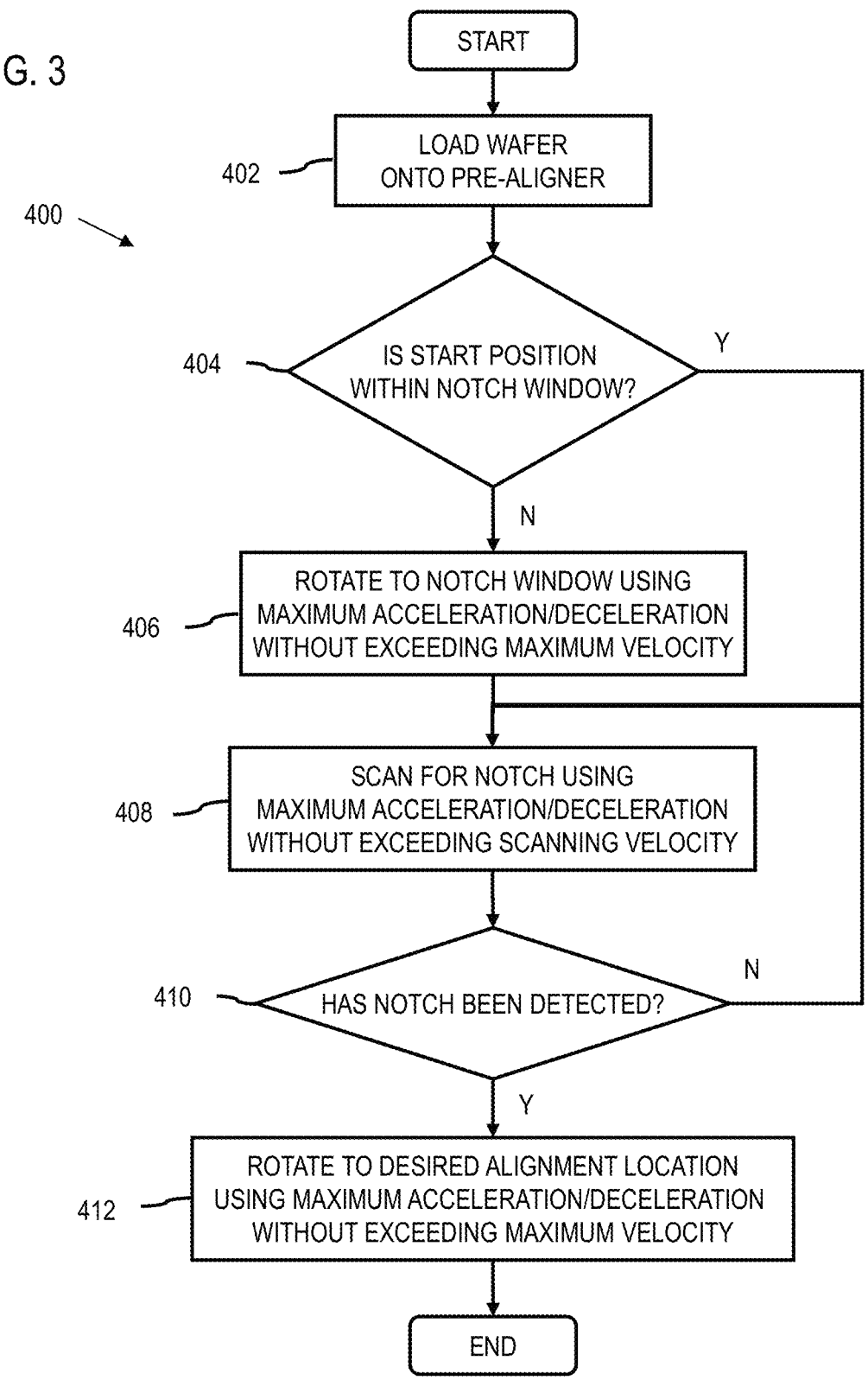
FIG. 3 is a flowchart of a process of a pre-alignment operation of the pre-aligner in which a performance of the pre-aligner is optimized.

Once the notch window is set, a performance of the pre-aligner can be optimized, for example, as discussed in relation to FIG. 3 describing a pre-alignment operation.

FIG. 3 depicts a pre-alignment operation including a process 400 that includes a step 402 of loading a wafer onto a pre-aligner.

In step 404, a determination is made as to whether or not a start position of the wafer is within a notch window stored in the notch memory. The start position is an angular position that aligns with a sensing area of a detection unit of the pre-aligner. Therefore, if the processor 1204 of the controller 1200 determines that the notch window stored in the notch memory overlaps the start position (e.g., if the notch window extends from −five degrees from the start position to +thirty degrees from the start positon), which would also be stored in the memory, then the process 400 would proceed to step 408 discussed below. However, if the processor 1204 of the controller 1200 determines that the start position is not within the notch window (e.g., if the notch window extends from +five degrees from the start position to +thirty degrees from the start positon), then the process 400 would proceed to step 406.

In step 406, the pre-aligner 200 will rotate the wafer W to the notch window using maximum acceleration/deceleration without exceeding a maximum velocity value. In other words, the pre-aligner will rotate the wafer W by accelerating and/or decelerating at maximum values in order to reach the notch window as fast as possible without exceeding the maximum velocity value. Thus, if the pre-aligner 200 is rotating the wafer at a maximum acceleration value and reaches the maximum velocity value before reaching the notch window, then the pre-aligner 200 will stop further acceleration, and will begin deceleration at a maximum deceleration value in order to reach the notch window at the scanning velocity (see, e.g., FIG. 9). The controller 1200 can calculate, based on the distance form the start position to a beginning point of the notch window and a maximum acceleration value, whether or not the scanning velocity will be reached or exceeded by the time the beginning point of the notch window has been reached by the rotation using the motor, and thus the computer system 1200 can calculate a motion profile, in the manner discussed in greater detail below with respect to FIGS. 4-9.

In step 408, the pre-aligner 200 would scan for the notch N using the detection unit 240. During step 408, the pre-aligner rotates the wafer W using maximum acceleration/deceleration without exceeding the scanning velocity. Thus, if the wafer W is being rotated at a velocity below the scanning velocity when the notch window has been reached, then the pre-aligner can rotate the wafer W using maximum acceleration until the scanning velocity has been reached, at which time the pre-aligner 200 will stop further acceleration.

In step 410, a determination is made as to whether or not the notch N has been detected. The processor 1204 of the controller 1200 will determine if the notch has been detected based on signals from the detection unit 240. If a determination is made that the notch N has not been detected, then the process 400 will loop back to step 408, and the pre-aligner 200 will continue to scan for the notch N using the detection unit 240. It is noted that, if the notch N is not detected within the notch window, either due to the detection unit 240 failing to detect the notch N or due to the starting point being within the notch window at a location past the notch location, then the process will continue scanning for the notch N at the scanning velocity until the notch N is detected, even if this required a full rotation or greater of the wafer W.

In step 410, if a determination is made that the notch N has been detected, then the process 400 continue to step 412 in which the pre-aligner 200 will rotate the wafer W to the desired alignment location (e.g., predetermined alignment location) using maximum acceleration/deceleration without exceeding a maximum velocity value. In other words, the pre-aligner will rotate the wafer W by accelerating and/or decelerating at maximum values in order to reach the desired alignment location as fast as possible and in as short a time period as possible without exceeding the maximum velocity value. Thus, if the pre-aligner 200 is rotating the wafer at a maximum acceleration value and reaches the maximum velocity value before reaching the desired alignment location, then the pre-aligner 200 will stop further acceleration, and will begin deceleration at a maximum deceleration value in order to reach and stop at the desired alignment location (see, e.g., FIG. 9). It is noted that the direction of rotation from the detection of the notch to the desired alignment location can either be a continuation of the direction during scanning for the notch (i.e., counterclockwise in the examples shown in FIGS. 4-9 below), or the direction can be reversed, depending upon which direction will produce the shortest time period to reach the desired alignment location.

Figure 4:
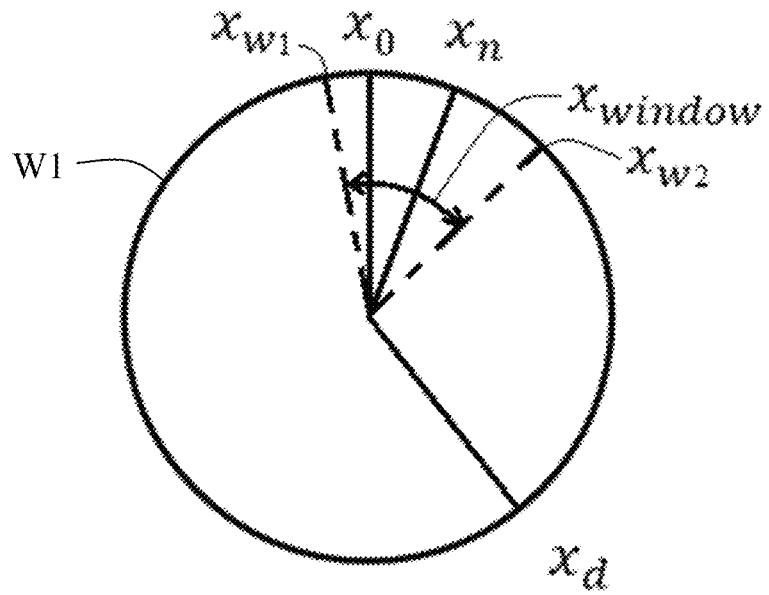
FIG. 4 depicts a schematic representation of a plan view of a wafer in a first starting point scenario.
Figure 5:
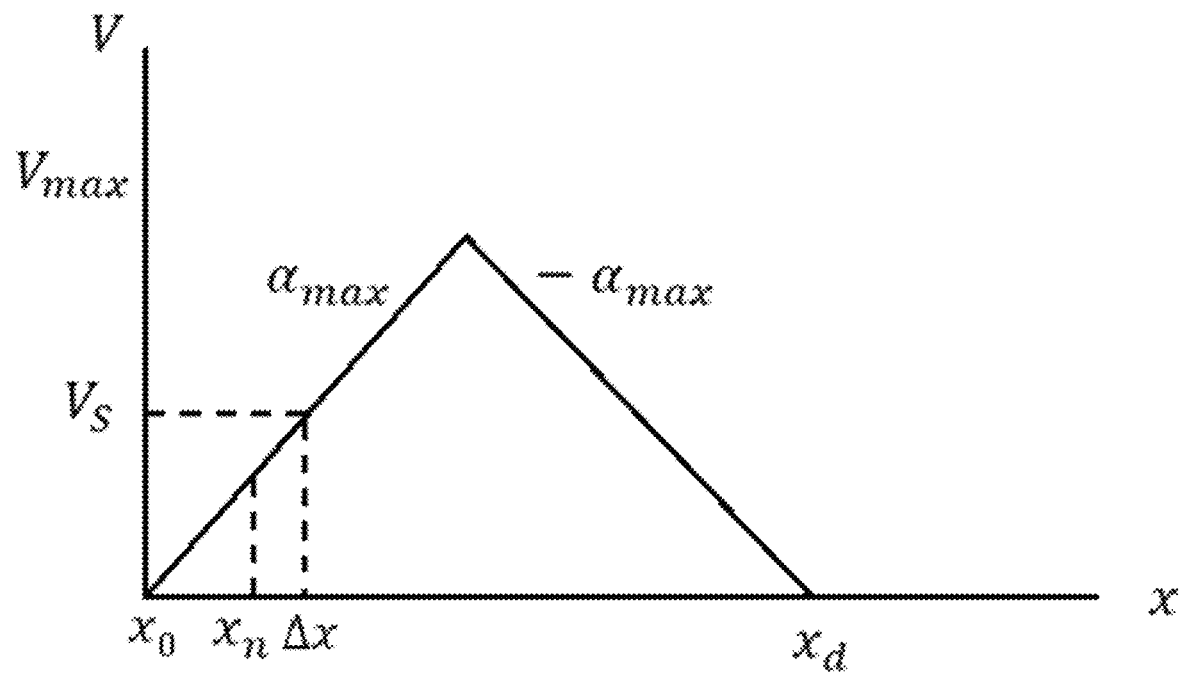
FIG. 5 depicts a graph of a motion profile for the wafer of FIG. 4 using the process of FIG. 3.
Figure 6:
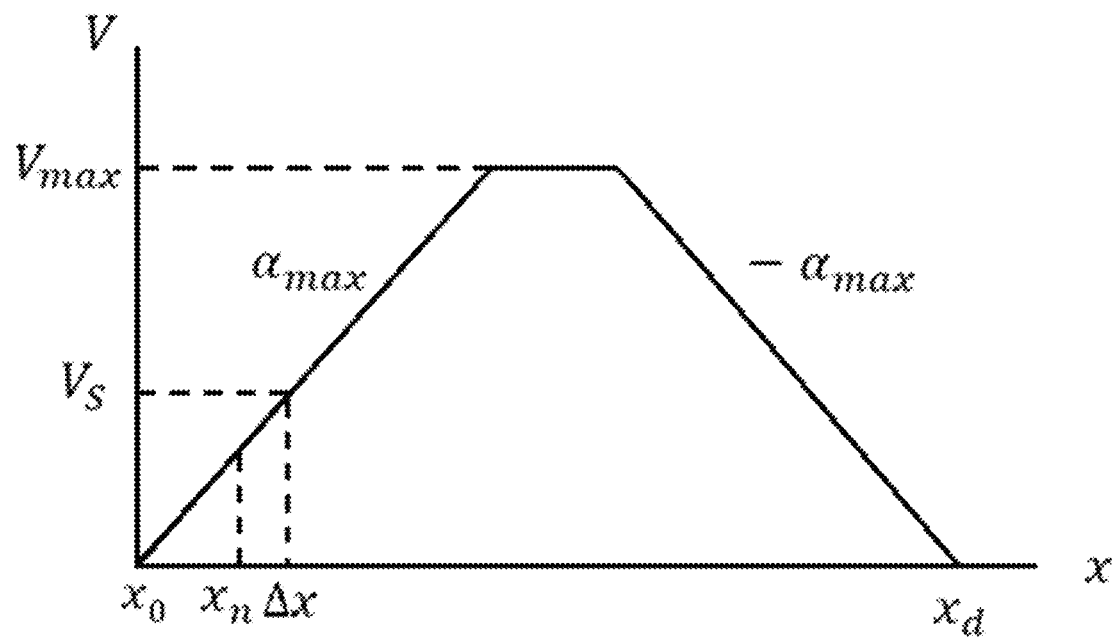
FIG. 6 depicts a graph of an alternative motion profile for the wafer of FIG. 4 using the process of FIG. 3 in a scenario in which a maximum velocity is reached during the motion profile after a detection of a notch.
Figure 7:
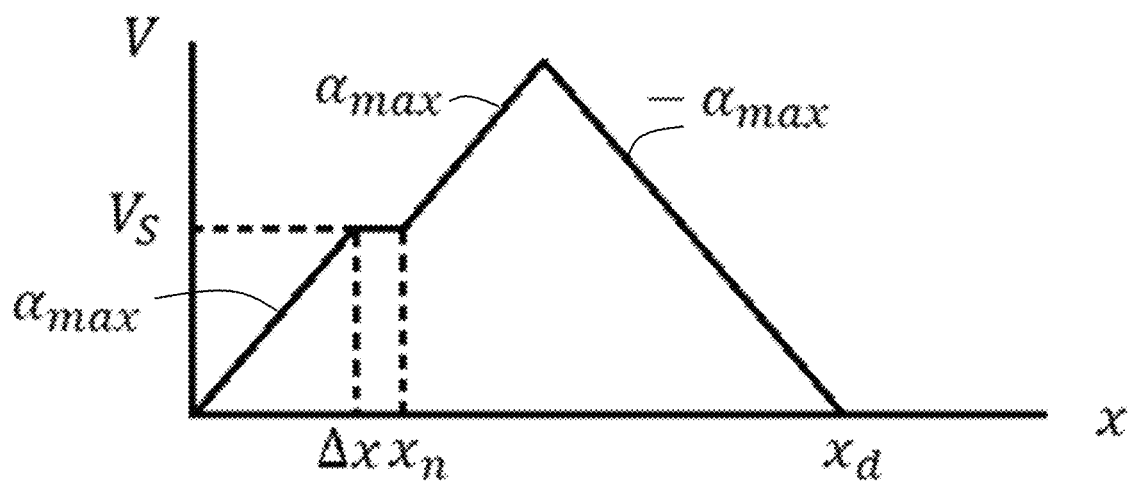
FIG. 7 depicts a graph of a further alternative motion profile for the wafer of FIG. 4 using the process of FIG. 3 in a scenario in which a maximum velocity is reached during the motion profile prior to a detection of a notch.
Figure 8:
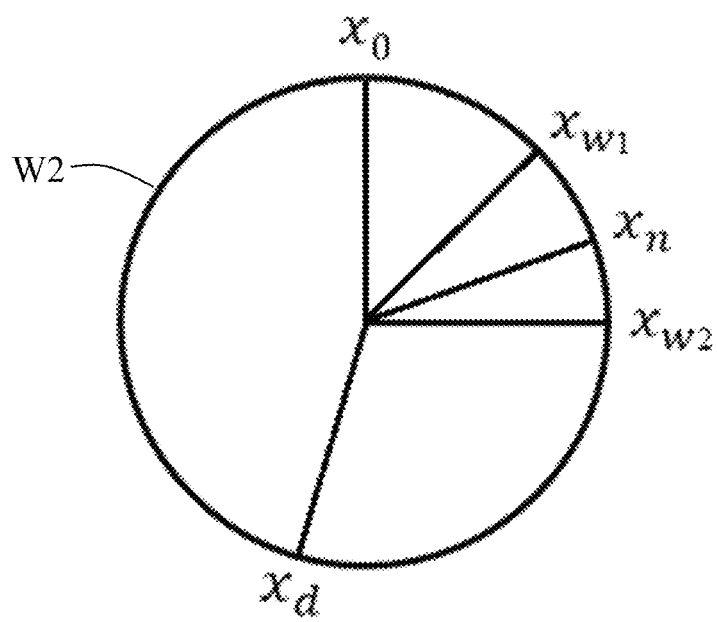
FIG. 8 depicts a schematic representation of a plan view of a wafer in a second starting point scenario.
Figure 9:
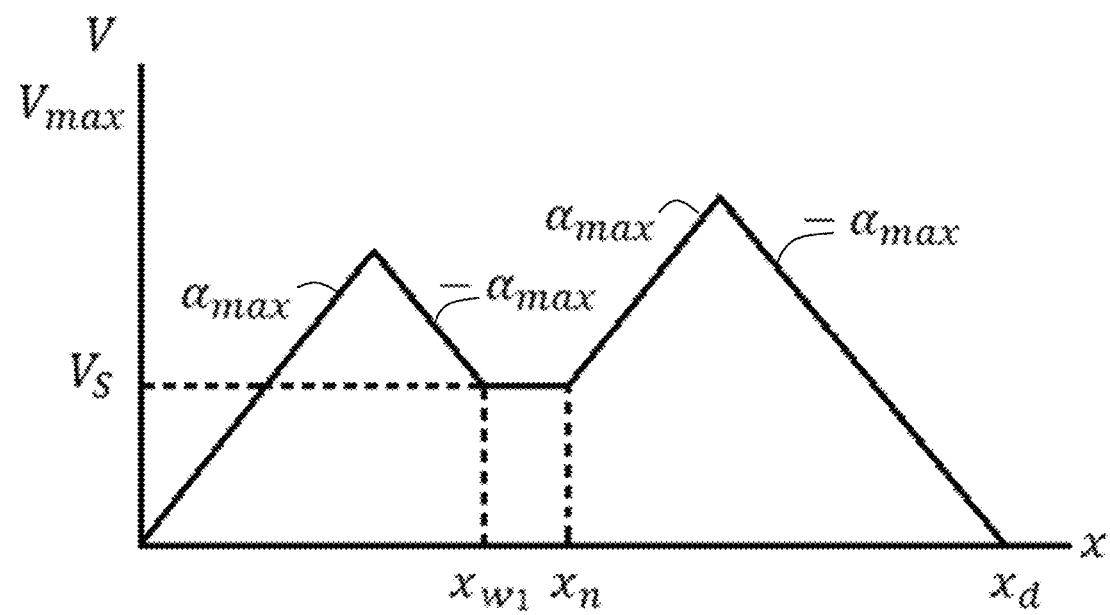
FIG. 9 depicts a graph of a motion profile for the wafer of FIG. 8 using the process of FIG. 3 in which a velocity greater than a scanning velocity is reached prior to reaching a notch window during the motion profile and a velocity greater than a scanning velocity is reached after detection of the notch.

FIGS. 4-9 set forth below depict various possible scenarios of the process 400 of FIG. 3. FIG. 4 depicts a schematic representation of a plan view of a wafer W1, and FIG. 5 depicts a graph of a motion profile for the wafer W1 of FIG. 4 using the process 400. FIG. 6 depicts a graph of an alternative motion profile for the wafer W1 of FIG. 4 using the process 400 in a scenario in which a maximum velocity $V_{max}$ is reached during the motion profile after the detection of the notch. FIG. 7 depicts a graph of a further alternative motion profile for the wafer W1 of FIG. 4 using the process 400 in a scenario in which a maximum velocity $V_{max}$ is reached during the motion profile prior to the detection of the notch. FIG. 8 depicts a schematic representation of a plan view of a wafer W2, and FIG. 9 depicts a graph of a motion profile for the wafer W2 of FIG. 8 using the process 400 in which a velocity greater than a scanning velocity is reached prior to reaching a notch window during the motion profile and a velocity greater than a scanning velocity is reached after detection of the notch.

The present disclosure involving finding of a notch and a notch window, and utilizing a memory storing such parameters provides a new technology that allows a pre-aligner to remember an approximate location (or range of locations) of the notch over time. Such technology will reduce maximum and average alignment times.

Motion profiles formed using an algorithm set forth herein will allow the pre-aligner to accelerate and decelerate to a notch window stored in memory and in which the notch is most likely to be present. While in the notch window, the pre-aligner will search for the notch at a scanning velocity. As soon as the pre-aligner detects the notch, the pre-aligner can determine how much further the wafer must be rotated to reach a desired location. To reach the desired alignment location, the pre-aligner can utilize maximum acceleration and maximum speed values, since no scanning is necessary during this motion. It is noted that it is necessary to rotate a minimum distance for edge-finding purposes.

Thus, the present disclosure provides a process in which: (i) maximum acceleration/deceleration is used to get to a notch window and enter the notch window at a scanning velocity; (ii) scanning is performed at the scanning velocity until notch is reached; and (iii) maximum acceleration/deceleration is used to get the wafer to a predetermined alignment location. The process is will also take into account maximum velocity to limit the rotational speed during motion outside of the notch window. The motion profiles can be tailored to how much more scanning is needed.

A first possible scenario involves a situation in which a wafer is placed on a pre-aligner such that the detector 250 is already in the notch window, with the notch directly clockwise from the detector 250. For example, such a scenario is depicted in FIG. 4, which show a schematic representation of a plan view of a wafer W1. Start point $x_0$ in FIG. 4 represents an angular position that aligns with a sensing area of the detector 250 of the pre-aligner. The notch window $x_{window}$ has a beginning point $x_{w1}$ and an end point $x_{w2}$ as shown in FIG. 4. The notch location $x_n$ and the desired or predetermined alignment location $x_d$ are shown in FIG. 4.

FIGS. 5-7 each show motion profiles for the wafer W1 of FIG. 4 using the process 400 in which the notch location $x_n$ is located close enough to the start point $x_0$ such that the wafer when rotated using maximum acceleration would not reach the scanning velocity prior to detecting the notch. The motion profiles in FIGS. 5 and 6 exists for cases in which the notch occurs prior to reach a range $\Delta x$, which is the distance it takes to reach the scanning velocity $V_S$ from a stop, while the motion profile in FIG. 7 exists for a case in which the notch occurs after reaching the range $\Delta x$. FIG. 6 depicts a graph of an alternative motion profile for the wafer W1 of FIG. 4 using the process 400 in a scenario in which a maximum velocity $V_{max}$ is reached during the motion profile after the notch is detect at notch location $x_n$ during the movement to the desired alignment location $x_d$.

Thus, a breakdown of the motion profiles are as follows: (i) initial maximum acceleration until the notch is reached; and continue forward at the maximum acceleration/deceleration unit the desired alignment location without exceeding maximum velocity. Because the controller 1200 can determine how far the desired alignment location is from the detected notch location, the controller 1200 can calculate whether the rotation unit 210 we can accelerate all the way up to the maximum velocity and continue at that speed before decelerating as shown in FIG. 6, or if it will be necessary to accelerate to a speed below the maximum velocity and begin decelerating prior to reaching maximum velocity as shown in FIG. 5.

A total move time can be broken-down as follows:

$$\Delta t_1 = \sqrt{2 * \frac{x}{\alpha_{max}}};$$

The time needed to reach the notch during initial acceleration;

$$\Delta t_2 = \frac{V - V_{int}}{\alpha_{max}} + \frac{V}{\alpha_{max}} + \left(\frac{x_{leftover}}{V_{max}}\right);$$

The time needed to reach the desired alignment location. This is dependent on how far from the notch the desired location is, as it determines whether there is enough space to accelerate from the intermediate velocity $V_{int}$ all the way up to the maximum velocity before cruising (shown in parentheses) and decelerating, or if the wafer can only accelerate to some lower velocity V before decelerating; and $\Delta t_{full} = \Delta t_1 + \Delta t_2 + \Delta t_f$: Total move time.

In order to solve for the velocity V in the $\Delta t_2$ term above, a system of three equations and three unknowns were developed as follows:

$V^2 = V_{int}^2 + 2\alpha x_{up}$: Describes how the wafer accelerates from the intermediate velocity to peak velocity;

$0 = V^2 + 2(-\alpha)x_{down}$: Describes how the wafer decelerates from the peak velocity to zero; and $x_{up} + x_{down} = x_{desired} - x_{notch}$: The distance covered during the acceleration and deceleration is equal to the distance from the notch to the desired alignment location.

$$V = \sqrt{\alpha(x_{desired} - x_{notch}) + \frac{V_{int}^2}{2}}$$

This process is repeated for the different profiles detailed below; however, with slightly modified equations.

Another possibility for when the wafer is placed such that the sensor is positioned within the window of the notch is that the notch is not located in the range Δx. The motion profile for this case is shown in FIG. 7 and is similar to the motion profile of FIG. 5 except that the pre-aligner must cruise at the scanning velocity until the notch is found.

The total move time down for the motion profile of FIG. 7 can be broken-down as follows:

$$\Delta t_1 = \sqrt{2 * \frac{x}{\alpha_{max}}}:$$

The time needed to reach the scanning velocity;

$$\Delta t_2 = \frac{(x_n - x_1)}{V_S};$$

$$\Delta t_3 = \frac{V - V_S}{\alpha_{max}} + \frac{V}{\alpha_{max}} + \left(\frac{x_{leftover}}{V_{max}}\right):$$

The time needed to reach the desired alignment location. This is dependent on how far from the notch the desired alignment location is, as it determines whether there is enough space to accelerate from the intermediate velocity $V_{int}$ all the way up to the maximum velocity before cruising (shown in parentheses) and decelerating, or if the wafer can only accelerate to some lower velocity V before decelerating; and $\Delta t_{full} = /t_1 + \Delta t_2 + \Delta t_3 + \Delta t_f$: Total move time.

A second possible scenario involves a situation in which a wafer is placed on a pre-aligner such that the detector 250 is initially positioned outside of the notch window. For example, such a scenario is depicted in FIG. 8, which shows a schematic representation of a plan view of a wafer W2. Start point $x_0$ in FIG. 8 again represents an angular position that aligns with a sensing area of the detector 250 of the pre-aligner. The notch window again has a beginning point $x_{w1}$ and an end point $x_{w2}$ as shown in FIG. 8. The notch location $x_n$ and the desired or predetermined alignment location $x_d$ are shown in FIG. 8. FIG. 9 shows motion profile for the wafer W2 of FIG. 8 using the process 400.

A breakdown of the motion profile relating the scenario shown in FIG. 8 is as follows:

$$\Delta t_1 = \frac{V}{\alpha_{max}} + \frac{V_S - V}{\alpha_{max}} + \left(\frac{x_{leftover}}{V_{max}}\right):$$

The time needed to reach the beginning of the notch window, $x_w$. This is dependent on how far the notch is from the initial start position, as it determines whether there is enough space to accelerate up to the maximum velocity before cruising (shown in parentheses) and decelerating, or if the wafer can only accelerate to some lower velocity V before decelerating;

$$\Delta t_2 = \frac{x_n - x_w}{V_S}:$$

The time needed to cruise at the scanning velocity from the edge of the window to the notch;

$$\Delta t_3 = \frac{V - V_S}{\alpha_{max}} + \frac{V}{\alpha_{max}} + \left(\frac{x_{leftover}}{V_{max}}\right):$$

The time needed to reach the desired alignment location. This is dependent on how far from the notch is from the desired alignment location, as it determines whether there is enough space to accelerate from the scanning velocity to the maximum velocity before cruising (shown in parentheses) and decelerating, or if the wafer can only accelerate to some lower velocity V before decelerating; and $\Delta t_{full} = /t_1 + \Delta t_2 + \Delta t_3 + \Delta t_f$: Total move time.

Due to the fact that the controller 1200 of the pre-aligner will know the position of the notch window after a period of time, and also that the detector 250 is able to scan in both directions, the pre-aligner 200 will be able to realize that if the notch is more than 180° away from the initial position in the clockwise direction, the wafer can be rotated in the counterclockwise direction and use the same motion profile scenarios detailed above.

The various detected notch locations, an average notch location, and a notch window (range) can be stored within a non-volatile memory (e.g., ROM 1208) on a board within the pre-aligner, in addition to being stored within memory 1206 of controller 1200. In this way, if the system is power cycled it can retain a history of such data.

It is noted that, if the notch is not found within the notch window as anticipated, the process can continue scanning at the scanning velocity until the notch is detected. The notch memory implementation is preferably used if notch locations are shown to be consistent within some range over some number of wafers.

It is noted that, as the pre-aligner rotates the wafer, a center of the wafer may not necessarily be placed on a center of the wafer chuck of the pre-aligner. Accordingly, an eccentricity caused by the offset can be found in order to find the wafer center. The present disclosure utilizes a least squares approximation to identify the center of the wafer with significantly less required rotation (e.g., 90 degrees) as compared to other method that can require approximately 360 degrees of rotation be scanned in order to locate the center of the wafer.

Figure 10:
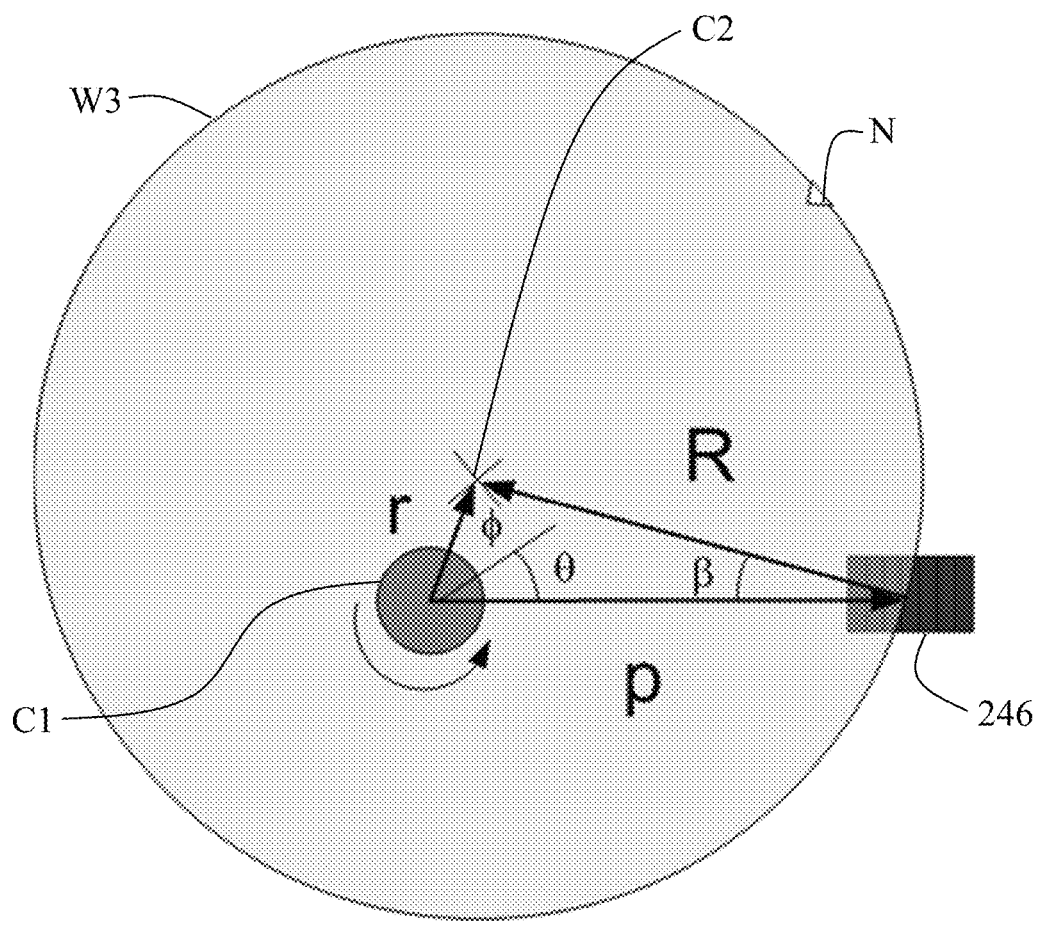
FIG. 10 sets forth a schematic representation of a wafer in relation to a center of a wafer chuck and a read head of a detector of a pre-aligner in order to determine eccentricity and find a center of the wafer.

FIG. 10 sets forth a schematic representation of a wafer W3 in relation to a center of a wafer chuck and a read head of a detector of a pre-aligner. FIG. 10 shows the wafer W3, a center C1 (e.g., a rotational center of wafer chuck 230), and read head 246 of detector 250 of pre-aligner 200. The pre-aligner rotates the wafer W3 by an angle θ. The center C2 of the wafer W3 may not necessarily be placed on the center C1 of the wafer chuck. The eccentricity is defined by a radius r and offset angle φ. As the wafer is rotated, ae magnitude of the vector p is measured for varying angles, θ. For a given wafer radius, R, the eccentricity can be found.

$$r^*\cos(\theta+\varphi)+R^*\cos(\beta)=p$$

$$r^*\sin(\theta+\varphi)-R^*\sin(\beta)=0$$

Thus, two equations are provided with three unknowns, r, φ, and β. Furthermore, β is a constantly fluctuating value as a function of the angle. Finally, the read head 246 will have some measurement width, making the position of the vector p in a direction orthogonal to pixels of the read head uncertain. The anticipated eccentricity is preferably no greater than 2 mm. Given a wafer radius of 150 mm, a maximum anticipated value for R*cos(β) is:

$$150-150^*\cos(\mathrm{atan}(2/150))=13\ \mathrm{microns}.$$

Given a small impact of the angle β, the cos(β) term is linearized as follows:

$$r^*\cos(\theta+\varphi)=p-R,$$

which may be rewritten as:

$$r^*\sin(\varphi)^*\cos(\theta)+r^*\cos(\varphi)^*\sin(\theta)=p-R.$$

This is a single equation with two unknowns. We may generate N equations with N subsequent rotation angles, allowing for a least squares approximation as follows:

$$[\cos(\theta)\sin(\theta)]^*[r^*\sin(\varphi)r^*\cos(\varphi)]^T=\{p-R\};$$

$$X^*A=b;$$

where X is N×2, A is 2×1, and b is N×1;

$$X^T{}^*X^*A=X^T{}^*b;$$

$$A=(X^T{}^*X)^{-1}{}^*X^T{}^*b.$$

In order to account for variable R and error in p, we reconsider the above equation as follows:

$$r^*\sin(\varphi)^*\cos(\theta)+r^*\cos(\varphi)^*\sin(\theta)=p-R.$$

For a perfect radius, we expect p to have a sinusoidal component as well as a steady state value:

$$r^*\sin(\varphi)^*\cos(\theta)+r^*\cos(\varphi)^*\sin(\theta)=p_o+\delta p+p_s-R-\delta R;$$

$$r^*\sin(\varphi)^*\cos(\theta)+r^*\cos(\varphi)^*\sin(\theta)-p_o-\delta p+R+\delta R=p_s.$$

We lump these steady state terms together as follows:

$$a=-p_o-\delta p+R+\delta R$$

such that, $$r^*\sin(\varphi)^*\cos(\theta)+r^*\cos(\varphi)^*\sin(\theta)+a=p_s$$

This is a single equation with three unknowns. We may generate N equations with N subsequent rotation angles, allowing for a least squares approximation as follows:

$$[\cos(\theta)\sin(\theta)1]^*[r^*\sin(\varphi)r^*\cos(\varphi)a]^T=\{p_s\};$$

$$X^*A=b;$$

where X is N×3, A is 3×1, and b is N×1;

$$X^T{}^*X^*A=X^T{}^*b;$$

$$A=(X^T{}^*X)^{-1}{}^*X^T{}^*b.$$

In this way, we have accounted for any variations in steady state offsets and extracted the pure eccentricity of the wafer.

Figure 11:
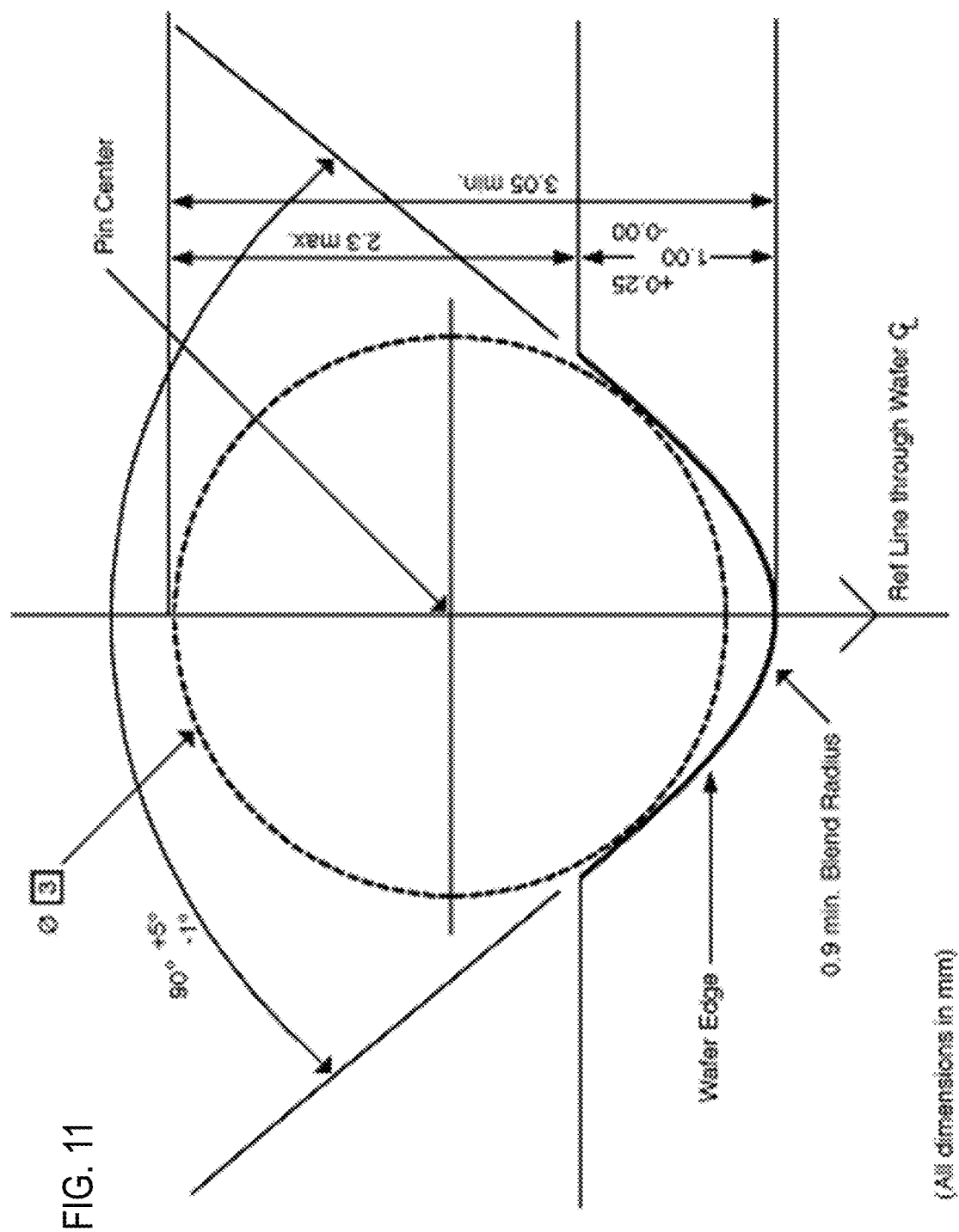
FIG. 11 depicts one example of conventional notch specifications.

FIG. 11 depicts notch specifications from a 2017 Semiconductor Equipment & Materials Institute (SEMI) M1 draft document on specifications for polished single crystal silicon wafers. It is noted that the pin shown in the outline of FIG. 11 can be used to align the notched wafer in a fixture during use. The pin can also be used to reference the notched wafer during testing for notch dimensions and dimensional tolerances. The notch dimensions shown in FIG. 11 assume a 3 mm diameter for this alignment pin. The notch dimensions are for illustrative purposes and are not intended to limit the scope of the claims set forth herein.

FIG. 12 illustrates an embodiment of a computer system (or controller) 1200 with which embodiments of the invention are implemented. Although computer system 1200 is depicted with respect to a particular device or equipment, it is contemplated that other devices or equipment (e.g., network elements, servers, etc.) can deploy the illustrated hardware and components of computer system 1200. The computer system 1200 is programmed (e.g., via computer program code or instructions) to provide the functionality described herein and includes a communication mechanism such as a bus 1202 for passing information between other internal and external components of the computer system 1200. One or more processors 1204 for processing information are coupled with the bus 1202 to perform a set of operations on information as specified by computer program code.

The computer system 1200 also includes a memory 1206 coupled to bus 1202. The memory 1206, such as a random access memory (RAM) or other dynamic storage device, stores information including processor instructions. The memory 1206 is also used by the processor 1204 to store temporary values during execution of processor instructions. The computer system 1200 also includes a read only memory (ROM) 1208 or other static storage device coupled to the bus 1202 for storing static information, including instructions, that is not changed by the computer system 1200. ROM 1208 or a separate memory connected to the bus 1202 can be provided as a non-volatile memory. The computer system 1200 includes a communication interface 1216 that allows the computer system 1200 to communicate with other devices or equipment (e.g., network elements, servers, an internal or external robot controller, etc.).

Information, including user input instructions, is provided to the bus 1202 for use by the processor 1204 from a user interface 1210, such as a keyboard containing alphanumeric keys operated by a human user, a display device, a pointing device (such as a mouse or a trackball or cursor direction keys).

A rotation unit 1212 (e.g., rotation unit 210 including motor 220 and any associate sensors for detecting rotation positions of the wafer chuck 230, as well as any device (e.g., suction device) provided on the wafer chuck 230 for holding the wafer, etc.) can communicate with the processor 1204 via the bus 1202 in order to send and receive data, operating instructions/commands, or other information therebetween. The processor 1204 can control operation of the drive device rotation unit 1212 using operating instructions/commands in order to control rotation (e.g., start, stop, direction (e.g., clockwise, counterclockwise), speed, etc.) of an output shaft (such as rotation shaft 222) of the motor 220.

It is noted that computer system 1200 could additionally be connected to a robot (e.g., robot 100) used to move the wafer. In such an arrangement, the robot could communicate with the processor 1204 via the bus 1202 in order to send and receive data, operating instructions/commands, or other information therebetween. In such an arrangement, the processor 1204 could control operation of the robot using operating instructions/commands in order to control actuation of the robot. Alternatively, the computer system 1200 can communicate with a separate controller of the robot via communication interface 1216 in order to operate in conjunction with the robot to load wafers onto the pre-aligner and retrieve wafers from the pre-aligner.

A detection unit 1214 (e.g. detection unit 240) can communicate with the processor 1204 via the bus 1202 in order to send and receive data, operating instructions/commands, or other information therebetween. The processor 1204 can control operation of the detection unit 1214 using operating instructions/commands in order to control operation of the detection unit 1214 in conjunction with the operation of the rotation unit 1214.

The computer system 1200 can be provided on the housing of the pre-aligner 200 or in wired connection to the other components of the pre-aligner 200, or the computer system 1200 can be provided at a remote location in wired or wireless communication with the other components of the pre-aligner 200.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A pre-aligner for pre-aligning a wafer having a notch on an outer peripheral edge thereof, the pre-aligner comprising:
    a rotation unit including:
        a wafer platform having a wafer receiving surface configured to receive the wafer; and
        a drive device configured to rotate the wafer platform about an axis;
    a detector configured to detect the notch of the wafer when the wafer is received on the wafer receiving surface;
    a memory configured to store a notch window defining a range of angles in which the notch is predicted to be located in relation to a start position at which the wafer is initially received on the wafer receiving surface, the start position corresponding to a sensing area of the detector; and
    a controller programmed to perform a pre-alignment operation in which the wafer is rotated from the start position to a predetermined alignment location,
    wherein the controller is programmed to perform the pre-alignment operation such that the wafer is rotated at maximum acceleration/deceleration values from the start position to a notch location detected by the detector:
        where the pre-alignment operation is limited to a maximum velocity for rotation of the wafer from the start position to a notch window; and
        where the pre-alignment operation is limited to a scanning velocity for rotation of the wafer within the notch window until the notch location is detected by the detector, the scanning velocity being less than the maximum velocity.

2. The pre-aligner according to claim 1, wherein the controller is programmed to further perform the pre-alignment operation such that the wafer is rotated at the maximum acceleration/deceleration values from the notch location detected by the detector to the predetermined alignment location where the pre-alignment operation is limited to the maximum velocity for rotation of the wafer from the notch location detected by the detector to the predetermined alignment location.

3. The pre-aligner according to claim 1, wherein the controller is programmed to minimize a time period for movement from the start position to the notch location detected by the detector.

4. The pre-aligner according to claim 1, wherein the controller is programmed to minimize a time period for movement from the start position to the predetermined alignment location.

5. The pre-aligner according to claim 1, wherein the controller is programmed to determine an eccentricity between a center of the wafer at the predetermined alignment location and a rotation center of the wafer platform having the wafer receiving surface using a least squares approximation.

6. The pre-aligner according to claim 1, further comprising a non-volatile memory configured to store the notch window.

7. A method comprising:
    providing a wafer platform having a wafer receiving surface configured to receive a wafer having a notch on an outer peripheral edge thereof;
    providing a detector configured to scan the outer peripheral edge of the wafer to detect the notch of the wafer when the wafer is received on the wafer receiving surface;
    setting a notch window defining a range of angles in which the notch is predicted to be located in relation to a start position at which the wafer is initially received on the wafer receiving surface, the start position corresponding to a sensing area of the detector; and
    performing a pre-alignment operation in which the wafer is rotated from the start position to a predetermined alignment location,
    wherein the pre-alignment operation is performed such that the wafer is rotated at maximum acceleration/deceleration values from the start position to a notch location detected by the detector:
        where the pre-alignment operation is limited to a maximum velocity for rotation of the wafer from the start position to a notch window; and
        where the pre-alignment operation is limited to a scanning velocity for rotation of the wafer within the notch window until the notch location is detected by the detector, the scanning velocity being less than the maximum velocity.

8. The method according to claim 7, wherein the pre-alignment operation is further performed such that the wafer is rotated at the maximum acceleration/deceleration values from the notch location detected by the detector to the predetermined alignment location where the pre-alignment operation is limited to the maximum velocity for rotation of the wafer from the notch location detected by the detector to the predetermined alignment location.

9. The method according to claim 7, wherein the notch window is set by:
  performing notch detection on a predetermined number of successive wafers to gather notch location data in relation to the start position;
  determining an angle range within which a predetermined percentage of the notch location data falls; and
  setting the notch window to the angle range.

10. The method according to claim 7, further comprising determining an eccentricity between a center of the wafer at the predetermined alignment location and a rotation center of the wafer platform having the wafer receiving surface using a least squares approximation.

11. The method according to claim 7, further comprising storing the notch window in a memory.

12. The method according to claim 7, further comprising storing the notch window in a non-volatile memory.

13. A method comprising:
  providing a wafer on a wafer platform having a wafer receiving surface, the wafer having a notch on an outer peripheral edge thereof;
  rotating the wafer on the wafer platform from a start position at which the wafer is initially received on the wafer receiving surface until a detector detects a notch location of the notch in relation to the start position, the start position corresponding to a sensing area of the detector;
  storing the notch location in a memory;
  repeating the providing, rotating, and storing for one or more successive wafers to gather and store notch location data in the memory;
  setting a notch window using the notch location data, the notch window defining a range of angles in which a subsequent notch of a subsequent wafer is predicted to be located in relation to the start position at which the subsequent wafer is initially received on the wafer receiving surface; and
  performing a pre-alignment operation on the subsequent wafer in which the subsequent wafer is rotated from the start position to a notch location of the subsequent wafer in a first minimum period of time using the notch window.

14. The method according to claim 13, wherein the pre-alignment operation is performed on the subsequent wafer in which the subsequent wafer is rotated from the start position to a predetermined alignment location in a second minimum period of time using the notch window.

15. The method according to claim 13,
  wherein the pre-alignment operation is performed on the subsequent wafer such that the subsequent wafer is rotated at maximum acceleration/deceleration values from the start position to the notch location detected by the detector:
    where the pre-alignment operation is limited to a maximum velocity for rotation of the subsequent wafer from the start position to the notch window; and
    where the pre-alignment operation is limited to a scanning velocity for rotation of the subsequent wafer within the notch window until the notch location is detected by the detector, the scanning velocity being less than the maximum velocity.

16. The method according to claim 15, wherein the pre-alignment operation is further performed such that the subsequent wafer is rotated at the maximum acceleration/deceleration values from the notch location detected by the detector to the predetermined alignment location where the pre-alignment operation is limited to the maximum velocity for rotation of the subsequent wafer from the notch location detected by the detector to the predetermined alignment location.

17. The method according to claim 13, wherein the notch window is set by:
  determining an angle range within which a predetermined percentage of the notch location data falls; and
  setting the notch window to the angle range.

18. The method according to claim 13, further comprising determining an eccentricity between a center of the subsequent wafer at the predetermined alignment location and a rotation center of the wafer platform having the wafer receiving surface using a least squares approximation.

19. The method according to claim 13, further comprising storing the notch window in a memory.

20. The method according to claim 13, further comprising storing the notch window in a non-volatile memory.

* * * * *